US010488895B2

(12) United States Patent
Schubert

(10) Patent No.: US 10,488,895 B2
(45) Date of Patent: Nov. 26, 2019

(54) COOLING ARRANGEMENT FOR COMPUTER SYSTEM

(71) Applicant: Fujitsu Technology Solutions Intellectual Property GmbH, München (DE)

(72) Inventor: Frank Schubert, Graben (DE)

(73) Assignee: Fujitsu Client Computing Limited, Kawasaki (JP)

( * ) Notice: Subject to any disclaimer, the term of this patent is extended or adjusted under 35 U.S.C. 154(b) by 0 days.

(21) Appl. No.: 15/117,750

(22) PCT Filed: Jan. 28, 2015

(86) PCT No.: PCT/EP2015/051731
§ 371 (c)(1),
(2) Date: Aug. 10, 2016

(87) PCT Pub. No.: WO2015/121069
PCT Pub. Date: Aug. 20, 2015

(65) Prior Publication Data
US 2016/0363968 A1    Dec. 15, 2016

(30) Foreign Application Priority Data

Feb. 14, 2014  (DE) .................. 10 2014 101 898

(51) Int. Cl.
*G06F 1/20*     (2006.01)
*H05K 1/02*    (2006.01)
*H05K 7/20*    (2006.01)

(52) U.S. Cl.
CPC ............. *G06F 1/20* (2013.01); *H05K 1/0203* (2013.01); *H05K 7/20145* (2013.01);
(Continued)

(58) Field of Classification Search
CPC .............. G06F 1/181–182; G06F 1/20; H05K 7/20218–20381; H05K 7/20409–20418;
(Continued)

(56) References Cited

U.S. PATENT DOCUMENTS 4,672,509 A * 6/1987 Speraw ................ H05K 7/1461
                                                                165/122
5,828,549 A * 10/1998 Gandre .................... G06F 1/20
                                                                361/695

(Continued)

FOREIGN PATENT DOCUMENTS

DE   10 2004 031 368 A1   10/2005
DE   10 2004 051 393 A1   12/2005
(Continued)

*Primary Examiner* — Robert J Hoffberg
*Assistant Examiner* — Razmeen Gafur
(74) *Attorney, Agent, or Firm* — DLA Piper LLP (US)

(57) ABSTRACT

A cooling arrangement for a computer system includes a printed circuit board with first and second heat-generating components; a first heat sink thermally coupled to the first heat-generating component, and a second heat sink thermally coupled to the second heat-generating component; and a first fan that generates an airflow in a direction of the first heat sink, wherein the second heat sink is arranged behind the first heat sink in a direction of airflow generated by the first fan; and an airscoop is arranged between the first heat sink and a blow-out opening of the first fan such that a first part of generated airflow is directly supplied through the airscoop to the first heat sink and a second part of the generated airflow flows around the airscoop and the first heat sink such that the second part of the generated airflow flows to the second heat sink.

18 Claims, 2 Drawing Sheets

(52) U.S. Cl.
CPC ..... *H05K 7/20154* (2013.01); *H05K 7/20436* (2013.01); *H05K 7/20727* (2013.01)

(58) Field of Classification Search
CPC ..... H05K 7/20009–202; H05K 1/0203; H05K 7/20145; H05K 7/20154; H05K 7/20436; H05K 7/20563; H05K 7/20727; H01L 23/367–3677; H01L 23/473; H01L 23/46–467; H01L 23/467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,400,568 | B1* | 6/2002 | Kim | G06F 1/20 165/104.33 |
| 6,504,718 | B2* | 1/2003 | Wu | H05K 7/20727 165/104.33 |
| 6,552,898 | B1* | 4/2003 | Noble | G06F 1/20 361/679.5 |
| 7,079,388 | B2* | 7/2006 | Faneuf | H05K 7/20727 361/679.51 |
| 8,300,405 | B2* | 10/2012 | Sun | G06F 1/20 165/185 |
| 9,075,581 | B2* | 7/2015 | Stock | G06F 1/20 |
| 2005/0041392 | A1* | 2/2005 | Chen | H05K 7/20727 361/695 |
| 2005/0167083 | A1* | 8/2005 | Belady | H01L 23/34 165/80.3 |
| 2005/0241802 | A1* | 11/2005 | Malone | H05K 7/20736 165/80.4 |
| 2005/0266790 | A1* | 12/2005 | Yu-Lin | G06F 1/20 454/184 |
| 2005/0286226 | A1* | 12/2005 | Ishii | H01L 23/467 361/697 |
| 2006/0012957 | A1* | 1/2006 | Arbogast | G06F 1/20 361/695 |
| 2006/0022529 | A1* | 2/2006 | De Filippis | F04D 25/082 310/58 |
| 2006/0137861 | A1* | 6/2006 | Wang | H01L 23/4006 165/104.33 |
| 2006/0181846 | A1* | 8/2006 | Farnsworth | G06F 1/20 361/695 |
| 2007/0109739 | A1* | 5/2007 | Stefanoski | G06F 1/187 361/679.47 |
| 2007/0165374 | A1* | 7/2007 | Chen | G06F 1/20 361/679.47 |
| 2007/0230184 | A1* | 10/2007 | Shuy | F21K 9/00 362/294 |
| 2008/0113607 | A1* | 5/2008 | Shih | G06F 1/20 454/233 |
| 2008/0225481 | A1* | 9/2008 | Anderl | G06F 1/20 361/695 |
| 2009/0010771 | A1* | 1/2009 | Vinson | F04D 25/082 417/366 |
| 2009/0231804 | A1* | 9/2009 | Franz | F04D 29/646 361/679.48 |
| 2009/0310304 | A1* | 12/2009 | Zhou | H01L 23/467 361/696 |
| 2010/0091463 | A1* | 4/2010 | Buresch | H01L 23/367 361/718 |
| 2011/0013356 | A1 | 1/2011 | Wang | |
| 2011/0051368 | A1* | 3/2011 | Chang | G06F 1/20 361/695 |
| 2011/0164382 | A1* | 7/2011 | Pirillis | H01R 13/6586 361/690 |
| 2011/0279969 | A1* | 11/2011 | Memon | G06F 1/20 361/679.47 |
| 2012/0044634 | A1 | 2/2012 | Huang et al. | |
| 2012/0099269 | A1* | 4/2012 | Tan | G06F 1/20 361/679.32 |
| 2012/0140405 | A1* | 6/2012 | Huang | G06F 1/20 361/679.47 |
| 2012/0162913 | A1* | 6/2012 | Lai | H05K 7/20145 361/695 |
| 2012/0212906 | A1 | 8/2012 | Chang | |
| 2012/0222841 | A1* | 9/2012 | Zhu | G06F 1/20 165/104.34 |
| 2012/0262880 | A1* | 10/2012 | Tsuchida | G06F 1/20 361/697 |
| 2012/0268890 | A1* | 10/2012 | Stock | G06F 1/20 361/679.53 |
| 2012/0289142 | A1* | 11/2012 | Liu | H05K 7/20145 454/284 |
| 2013/0050941 | A1* | 2/2013 | Wang | G06F 1/203 361/692 |
| 2013/0083483 | A1* | 4/2013 | Wei | H01L 23/467 361/697 |
| 2013/0100611 | A1* | 4/2013 | Weiss | H05K 7/20163 361/690 |
| 2014/0355211 | A1* | 12/2014 | Patil | H05K 1/0201 361/695 |
| 2016/0037677 | A1* | 2/2016 | Yamanaka | H05K 7/20918 361/697 |

FOREIGN PATENT DOCUMENTS

| | | |
|---|---|---|
| DE | 10 2010 054 281 A1 | 6/2012 |
| WO | 96/01035 A1 | 1/1996 |

* cited by examiner

COOLING ARRANGEMENT FOR COMPUTER SYSTEM

TECHNICAL FIELD

This disclosure relates to cooling arrangement for a computer system having a main printed circuit board with a first heat-generating component and with a second heat-generating component.

BACKGROUND

Computer systems, in particular desktop, tower or workstation PCs, during operation thereof, generate a relatively large amount of heat which has to be removed for reliable operation of the particular computer system. One or more processors of the computer system constitute a substantial heat source. Computer systems such as workstation PCs, which are distinguished by high graphic and computer capacities, are typically equipped with at least two processors to provide this capacity.

In computer systems of this type with at least two processors, the latter are generally arranged one behind another and are cooled via a respective fan. A disadvantage in is that the cooling air sucked up by the first fan for cooling purposes is initially heated by the heat of the first processor and subsequently used to cool the second processor. Due to the fact that the cooling air is heated by the first processor and therefore strikes in preheated form against the second fan, less cooling capacity is available to cool the second processor. This has the consequence that the second processor regularly has a higher temperature compared to the first processor. A further consequence is that a rotational speed of the fan has to be comparatively high for sufficient cooling of the two processors, as a result of which, in addition to high energy consumption, an annoying production of noise also occurs.

It could therefore be helpful to provide a cooling arrangement for a computer system distinguished by a simple construction and particularly efficient cooling.

SUMMARY

I provide a cooling arrangement for a computer system including a main printed circuit board with a first heat-generating component and a second heat-generating component; a first heat sink thermally coupled to the first heat-generating component, and a second heat sink thermally coupled to the second heat-generating component; and a first fan that generates an airflow in a direction of the first heat sink; wherein the second heat sink is arranged behind the first heat sink in a direction of flow of the airflow generated by the first fan; and an air duct is arranged between the first heat sink and a blow-out opening of the first fan such that a first part of generated airflow is directly supplied through the air duct to the first heat sink and a second part of the generated airflow flows around the air duct and the first heat sink such that the second part of the generated airflow flows to the second heat sink.

LIST OF REFERENCE NUMBERS

Figure 1:
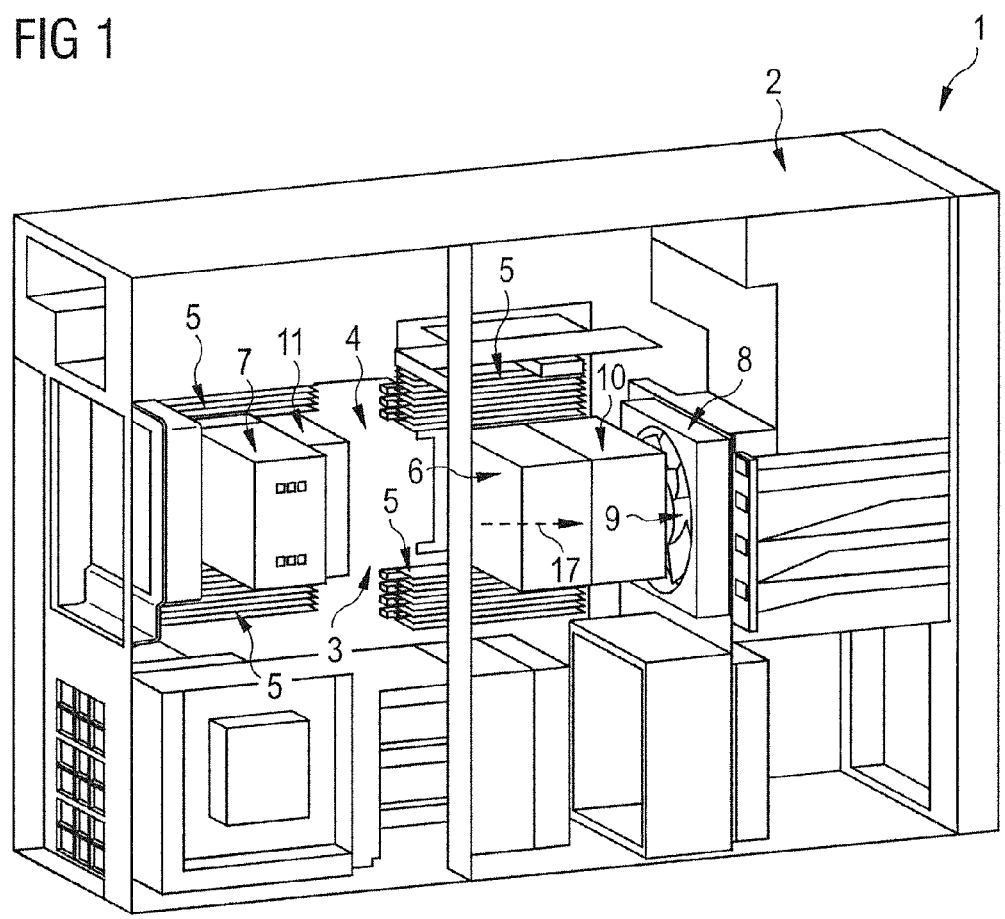
FIG. 1 shows a schematic perspective view of a computer system with a cooling arrangement according to an example.

1 Computer system
2 Housing
3 Cooling arrangement
4 Main printed circuit board
5 Memory banks
6 First heat sink
7 Second heat sink
8 First fan
9 Blow-out opening
10 air duct
11 Second fan
12 Area
13 Side wall
14 First arrow direction
15 Second arrow direction
16 Third arrow direction
17 Arrow
18 Fourth arrow direction

DETAILED DESCRIPTION

I provide a cooling arrangement for a computer system having a main printed circuit board with a first heat-generating component and with a second heat-generating component. The cooling arrangement has a first heat sink thermally coupled to the first heat-generating component, and a second heat sink thermally coupled to the second heat-generating component. In addition, the cooling arrangement has a first fan that generates an airflow in the direction of the first heat sink. The second heat sink is arranged behind the first heat sink in the direction of flow of the airflow generated by the first fan. Furthermore, an air duct is arranged between the first heat sink and the blow-out opening of the first fan such that a first part of the generated airflow is supplied via the air duct to the first heat sink and a second part of the generated airflow flows around the air duct and the first heat sink.

The cooling arrangement permits a simple construction and particularly effective cooling of both of the first heat-generating component and of the second heat-generating component. The two heat-generating components which are, for example, processors of the computer systems each have a heat sink, for example, a lamella-like cooling body. The two heat sinks are arranged one behind the other, i.e., approximately in a row, behind the first fan generating the airflow in the direction of the first heat sink. Part of the generated airflow of the first fan is supplied via the air duct directly, i.e., virtually exclusively, to the first heat sink, while a second part of the generated airflow goes around the air duct of the first heat sink, in particular laterally. As a result, it is possible for the second part of the generated airflow substantially not to be heated, or only slightly heated, by the first heat sink or by further heat-generating components when flowing around the first heat sink. The second part can then flow to the second heat sink arranged behind the first heat sink, and can particularly effectively and efficiently cool the second heat sink. The heat of the second heat sink is therefore not exclusively cooled by the air already heated by the first heat sink, as a result of which a cooling capacity of a second heat sink would noticeably drop. The air duct therefore permits a type of bypass for the second part of the air.

I surprisingly found that, compared to known computer systems in which, during operation, there is a temperature difference between the first heat-generating component and the second heat-generating component of several degrees Celsius, approximately 8° C., my arrangement results in the first heat-generating component and the second heat-generating component having approximately the same temperature.

In addition, by the described cooling arrangement, the rotational speed of the first fan can be reduced compared to known computer systems, wherein an annoying production of noise is reduced and the energy consumption of the first fan is lowered.

Advantageously, an area of the blow-out opening of the first fan, which area faces the first heat sink, may be greater than an area of the first heat sink, which area faces the blow-out opening and is projected in a plane parallel to the blow-out opening. The area of the blow-out opening of the first fan preferably overlaps the area of the first heat sink, which area faces the blow-out opening and is projected into the plane parallel to the blow-out opening. As a result, an airflow having a particularly large flow cross section, in particular larger than the projected area of the first heat sink, which area faces the blow-out opening of the first fan, can be generated by the first fan. The effect can therefore be achieved that the second part of the generated airflow makes up a large portion of the entire generated airflow of the first fan and therefore cooling air can be sufficiently supplied to the second heat sink. In particular, the second part of the generated airflow can flow unobstructed past the first heat sink, i.e., without vortices.

The projection involves, as also below, a depiction of points of a three-dimensional body, in this case of a heat sink, into a given plane, wherein the projection beams are parallel to one another. In the structure described here, the projection beams strike at a right angle against the projection plane, i.e., the plane of the blow-out opening, wherein an orthogonal projection is involved.

The air duct may have a flow cross section corresponding to an area of the first heat sink, which area faces the blow-out opening and is projected into a plane parallel to the blow-out opening. The effect achieved is that the first heat sink is sufficiently cooled, wherein this ensures in particular that cooling air is supplied via the air duct to the entire area facing the blow-out opening of the first fan.

The air duct may be a hollow body with a first opening and with a second opening opposite the first opening, wherein the first opening faces the blow-out opening of the first fan and the second opening faces the first heat sink. The hollow body preferably has a continuous, constant flow cross section and is, for example, of cylindrical or cuboidal configuration. As a result, it is ensured that the first part of the airflow generated by the first fan can be supplied via the first opening directly and without vortices to the first heat sink. In particular, there are therefore no pressure losses within the hollow body and therefore no loss of cooling capacity.

The air duct may be arranged on the first fan such that the first opening bears against a side of the first fan, which side has the blow-out opening. In addition or alternatively, the air duct is arranged with a second opening in the first heat sink or, by the second opening, at least partially surrounds the heat sink in the direction of a flow direction of the generated airflow of the first fan.

As a result, it is possible for the first part of the airflow generated by the first fan to be able to be supplied directly via a first opening of the air duct. By the air duct being arranged with the second opening on the first heat sink or at least partially enclosing the latter, the first part of the generated airflow of the first fan can be supplied directly and completely to the first heat sink.

A flow cross section of the air duct, which flow cross section is delimited by the first opening, is preferably smaller than the area of the blow-out opening of the first fan. The effect achieved is that the first part of the airflow generated by the first fan is supplied to the air duct, while the second part of the generated airflow of the first fan can flow around the air duct and therefore be used to cool the second heat sink by the heat-generating component.

A second fan that generates an airflow onto the second heat sink may be arranged in a region of the second heat sink. The second fan is preferably arranged between the first heat sink and the second heat sink and at least partially within the airflow generated by the first fan. The second fan here is particularly preferably arranged on the second heat sink on a side thereof that faces the first fan or the first heat sink.

By the second fan, it is possible particularly effectively to cool the second heat sink, wherein the second fan in particular sucks up the second part of the airflow generated by the first fan. The air of the airflow generated by the first fan is accelerated by the second fan and, therefore, sufficient cooling capacity for the second heat-generating component is provided.

Further refinements are described in the following detailed description of an example with the aid of the figures.

FIG. 1 schematically shows a perspective view of a computer system 1 having a housing 2 and a cooling arrangement 3 arranged in the interior of the housing 2. In the interior of the housing 2, the computer system 1 is equipped with a main printed circuit board 4. Two processors (CPUs) not illustrated and which constitute a first heat-generating component and a second heat-generating component of the computer system 1 are located on the main printed circuit board 4. In addition to the two processors, further heat-generating components such as, for example, memory banks 5, are arranged on the main printed circuit board 4 and in the interior of the housing 2.

In particular, during operation of the computer system 1 which, in the example is a workstation PC, the two processors generate a high waste heat having to be removed for reliable operation of the computer system 1 to protect the computer system 1 against malfunctions and/or functional impairments. For this purpose, the cooling arrangement 3 has a first heat sink 6 arranged on the first processor, and a second heat sink 7 arranged on the second processor. The two heat sinks 6 and 7 are considered as lamella-like, cuboidal cooling bodies and, by a surface, are in thermal contact with the corresponding processor. The two heat sinks 6, 7 are of identical size, as a result of which costs can be saved by using an identical structural element. The two heat sinks can also differ in size. Instead of the lamella-like cooling bodies, other configurations of heat sinks, for example, heat pipes, can also be used. In a further alternative, instead of the thermal coupling by a surface of the two heat sinks 6 and 7, a thermal coupling can also be brought about with the aid of one or more heat types that remove heat from the processor and supply heat to a heat sink 6 and 7, for example, to the lamella-like cooling body.

Opposite the first heat sink 6, a first fan 8 is arranged in the interior of the housing 2, the fan sucking up fresh air from the surrounding of the housing 2 to cool the first heat sink 6 and the second heat sink 7. The second fan 11 is arranged on a side of the second heat sink 7, which side faces the first heat sink 6 and the first fan 8. The first fan 8, the first heat sink 6, the second fan 11 and second heat sink 7 are overall arranged substantially in a row one behind another and are located in an imaginary, geometrical, rectilinear flow duct. The two heat sinks 6 and 7 can be arranged centrally with respect to each other, i.e., for example, centrally with respect to a center longitudinal axis, or slightly offset with respect to each other, as shown in the example according to FIG. 1 (also see FIG. 3). The two fans 8 and 11 are designed as axial fans, wherein, alternatively, other fan configurations are also provided.

The cooling arrangement 3 is supplemented by an air duct 10 arranged between a flow-out opening 9 of the first fan 8 and the first heat sink 6.

The cooling arrangement 3 and the cooling principle of the latter are described in detail below with the aid of FIGS. 2 and 3.

Figure 2:
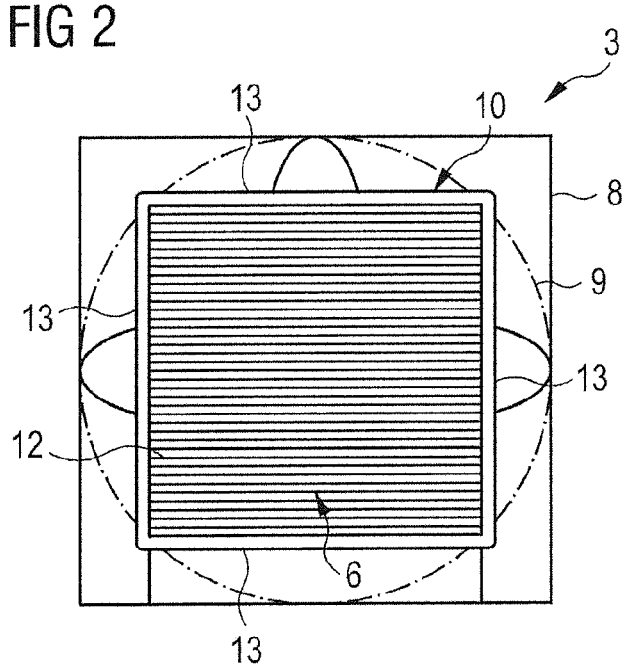
FIG. 2 shows a schematic rear view of the cooling arrangement.

FIG. 2 shows a rear view of part of the cooling arrangement 3, starting from the first heat sink 6 in the direction of view of the arrow 17, which is illustrated by dashed lines in FIG. 1, towards the air duct 10 and the first fan 8 located there behind. FIG. 3 shows a schematic side view of the cooling arrangement 3. For overview reasons, a multiplicity of the components of the computer system 1 are not illustrated in FIGS. 2 and 3.

As illustrated in FIG. 2, an area of the blow-out opening 9 of the first fan 8 is larger than an area 12 (illustrated in striped form) of the first heat sink 6, which area faces the blow-out opening 9. The area 12 corresponds to a side of the first heat sink 6, which side faces the first fan 8 and is parallel to the area of the blow-out opening 9. The area 12 can also be designed as an area facing the first fan 8 and is projected (orthogonally) into a plane parallel to the blow-out opening 9. The first fan 8 is arranged substantially centrally with respect to the first heat sink 6, wherein the blow-out opening 9 of the first fan 8 overlaps the area 12 of the first heat sink 6 and four side walls 13 of the air duct 10. In other words, the blow-out opening 9 extends radially at least partially over a larger region than the first heat sink 6 projected (orthogonally) into the plane parallel to the blow-out opening 9.

The air duct 10 is configured as a hollow body and has a first opening facing the first fan 8 and a second opening facing the heat sink 6. The first opening and the second opening are opposite each other. The air duct 10 is designed as a closed, cuboidal hollow body with the four side walls 13. Alternatively, the air duct 10 has a U-shaped profile with three side walls 13, in which case, for example, the lower side wall 13 of FIG. 2 is omitted. The air duct 10 forms a flow duct for an airflow generated by the first fan. Alternative examples such as a cylindrical configuration, are provided for the air duct 10.

The air duct 10 is arranged with the second opening on the first heat sink 6. Alternatively, the air duct 10 can also surround part of the first heat sink 6 by the second opening.

Figure 3:
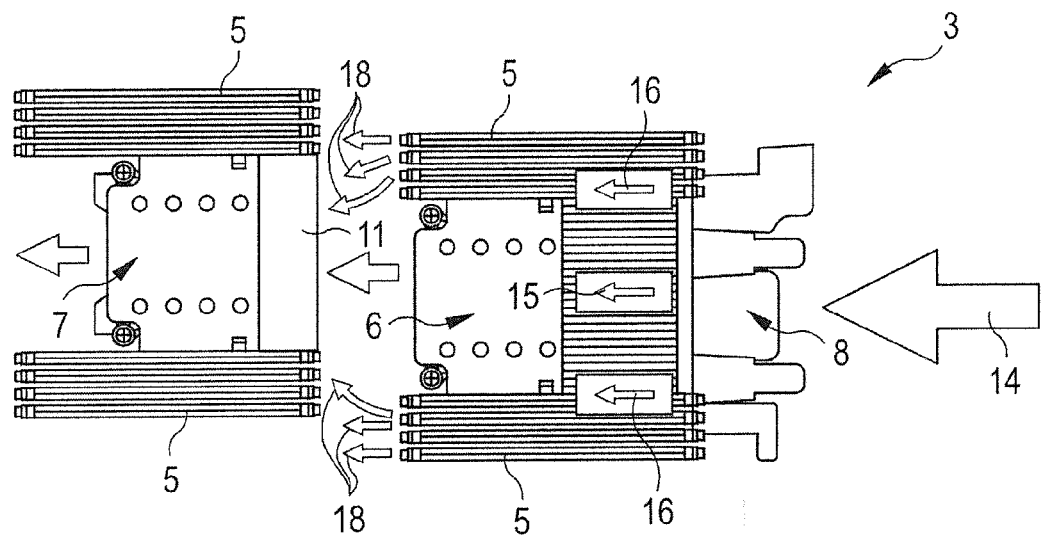
FIG. 3 shows a schematic top view of the cooling arrangement.

If, as illustrated schematically in FIG. 3, cooling air is now sucked up by the first fan from outside the housing 2 of the computer system 1 in accordance with a first arrow direction 14, the first part of the generated airflow is supplied directly to the first heat sink 6 by the air duct 10 in accordance with the second arrow direction 15. Owing to the fact that the blow-out opening 9 of the first fan 8 at least partially laterally overlaps the air duct 10, as described above, a second part of the generated airflow is guided laterally past the air duct 10 and also laterally past the first heat sink 6 in accordance with the arrow directions 16. The air duct 10 therefore ensures that the airflow generated by the first fan 8 is partially directly supplied to the first heat sink 6, while the second part of the generated airflow flows around the air duct 10 and the heat sink 6. The air duct 10 therefore permits a type of bypass for the second part of the airflow generated by the first fan 8.

The first part of the generated airflow, which part flows through the first heat sink 6 in accordance with the second arrow direction 15, is slightly retarded during the flow through the first heat sink 6 since the first heat sink 6 causes a flow obstacle. The first part of the generated airflow absorbs the heat removed from the processor. The second part of the generated airflow, which flows laterally around the first heat sink 6 in accordance with the third arrow directions 16, at least partially flows in accordance with fourth arrow directions 18 to the second heat sink 7, which is arranged behind the first heat sink 6. Since the second part of the generated airflow flows without obstruction, that part generally has a greater velocity than the first part. The substantially unheated air of the second part of the generated airflow of the first fan 8 is sucked up by the second fan 11 and supplied directly to the second heat sink 7. In addition to the second part of the generated airflow of the first fan 8, the air of the first part of the generated airflow of the first fan 8, which air is heated by the first heat sink 6, is likewise sucked up by the second fan 11, wherein, when the rotational speed of the second fan 11 is appropriately set, the second heat sink 7 can be particularly efficiently cooled.

The effect achieved by the cooling arrangement 3 is that the two processors essentially have an identical temperature during operation. In addition, the fan rotational speeds of the first fan 8 and of the second fan 11 can be set such that no particularly annoying production or emission of noise occurs.

In the example according to FIGS. 1 to 3, the second fan 11 is of a smaller size than the first fan 8. A blow-out opening of the second fan 11 is smaller than the blow-out opening 9 of the first fan 8. Owing to the fact that the second part of the airflow generated by the first fan 8 substantially has a temperature corresponding to the ambient temperature of the computer system 1, the second fan 11 can be dimensioned to be smaller than the first fan 8 such that a sufficient cooling capacity can be provided by the second fan 11 for effective cooling of the second heat sink 7.

In the example, the air duct 10, because of the cuboidal configuration, has a constant flow cross section which substantially corresponds to that side of the first heat sink 6 facing the first fan 8. Alternatively, the flow cross section can also be smaller or larger than that area of the first heat sink 6 facing the first fan 8. In addition or alternatively, the flow cross section of the air duct 10 can also change, for example, can become smaller or larger, in the direction of flow of the generated airflow of the first fan 8.

The air duct 10 is arranged with the two openings thereof both directly on the blow-out opening 9 of the first fan 8 and on the first heat sink 6. In alternative examples, the first opening is arranged spaced apart from the blow-out opening 9 of the first fan 8. In a further alternative example, the second opening of the air duct 10 is arranged spaced apart from the first heat sink 6.

In a further alternative example (not illustrated), the second fan 11 is omitted, wherein the first fan 8 provides sufficient cooling capacity and, wherein, in particular, the second part of the generated airflow suffices to cool the second heat sink 7.

In the example, the memory banks 5 are laterally arranged next to the heat sinks 6 and 7. In the example, the memory banks 5 are cooled at the same time by the second part of the airflow generated by the first fan 8. The memory banks generate significantly lower waste heat compared to the processors and, therefore, the waste heat can easily be absorbed by the second part of the generated airflow of the first fan without noticeably raising the temperature of the second part. As a result, it is ensured that the heat of the second heat sink 7 can be removed efficiently.

In the example, the second part of the generated airflow of the first fan flows substantially around the air duct 10 on all sides 13. Alternatively, the first heat sink 6 and/or the air duct 10 itself is arranged with respect to the first fan 8 such that, for example, the second part of the generated airflow of the first fan flows only around one side wall 13 or two side walls 13 of the air duct 10 and/or of the first heat sink 6. The abovementioned advantages and the efficient cooling of the second heat sink 7 are also produced here.

The invention claimed is:

1. A cooling arrangement for a computer system comprising:
    a main printed circuit board with a first heat-generating component and a second heat-generating component;
    a first heat sink thermally coupled to the first heat-generating component, and a second heat sink thermally coupled to the second heat-generating component; and
    a first fan that generates an airflow in a direction of the first heat sink,
wherein
    the second heat sink is arranged behind the first heat sink in a direction of flow of the airflow generated by the first fan; and
    an air duct arranged between the first heat sink and a blow-out opening of the first fan, wherein
        the air duct is a hollow body with a first opening and a second opening opposite the first opening,
        the first opening faces the blow-out opening of the first fan and the second opening faces the first heat sink;
        an area of the blow-out opening of the first fan, which area of the blow-out opening faces the first heat sink, is greater than an area of the first heat sink, which area of the first heat sink faces the blow-out opening and is projected in a plane parallel to the blow-out opening; and
        the air duct has a flow cross section corresponding to the area of the first heat sink, which area of the first heat sink faces the blow-out opening and is projected into a plane parallel to the blow-out opening;
    such that a first part of generated airflow is exclusively supplied through the air duct to the first heat sink and a second part of the generated airflow flows laterally around the air duct and the first heat sink such that the second part of the generated airflow flows to the second heat sink.

2. The cooling arrangement according to claim 1, wherein an area of the blow-out opening overlaps an area of the first heat sink, which area faces the blow-out opening and is projected into a plane parallel to the blow-out opening.

3. The cooling arrangement according to claim 1, wherein the air duct is arranged on the first fan such that the first opening is arranged on a side of the first fan, which side has the blow-out opening.

4. The cooling arrangement according to claim 1, wherein the air duct is arranged with the second opening on the first heat sink or, by the second opening, encloses the first heat sink at least partially in the direction of a flow direction of the generated airflow of the first fan.

5. The cooling arrangement according to claim 1, further comprising a second fan that generates an airflow onto the second heat sink and is arranged in a region of the second heat sink.

6. The cooling arrangement according to claim 1, wherein the first heat sink and/or the second heat sink are cooling bodies with lamellae.

7. A cooling arrangement for a computer system comprising:
    a main printed circuit board with a first heat-generating component and a second heat-generating component;
    a first heat sink thermally coupled to the first heat-generating component, and a second heat sink thermally coupled to the second heat-generating component; and
    a first fan that generates an airflow in a direction of the first heat sink,
wherein
    the second heat sink is arranged behind the first heat sink in a direction of flow of the airflow generated by the first fan; and
    an air duct is arranged between the first heat sink and a blow-out opening of the first fan such that a first part of generated airflow is exclusively supplied through the air duct to the first heat sink and a second part of the generated airflow flows laterally around the air duct and the first heat sink such that the second part of the generated airflow flows to the second heat sink,
    wherein a flow cross section of the air duct, which flow cross section of the air duct is delimited by the first opening, is smaller than an area of the blow-out opening of the first fan.

8. The cooling arrangement according to claim 7, wherein an area of the blow-out opening overlaps an area of the first heat sink, which area faces the blow-out opening and is projected into a plane parallel to the blow-out opening.

9. The cooling arrangement according to claim 7, wherein the flow cross section of the air duct corresponds to an area of the first heat sink, which area faces the blow-out opening and is projected into a plane parallel to the blow-out opening.

10. The cooling arrangement according to claim 7, wherein the air duct is a hollow body with a first opening and with a second opening opposite the first opening, wherein the first opening faces the blow-out opening of the first fan and the second opening faces the first heat sink.

11. The cooling arrangement according to claim 10, wherein the air duct is arranged on the first fan such that the first opening is arranged on a side of the first fan, which side has the blow-out opening.

12. The cooling arrangement according to claim 10, wherein the air duct is arranged with the second opening on the first heat sink or, by the second opening, encloses the first heat sink at least partially in the direction of a flow direction of the generated airflow of the first fan.

13. The cooling arrangement according to claim 7, further comprising a second fan that generates an airflow onto the second heat sink and is arranged in a region of the second heat sink.

14. The cooling arrangement according to claim 7, wherein the first heat sink and/or the second heat sink are cooling bodies with lamellae.

15. A cooling arrangement for a computer system comprising:
    a main printed circuit board with a first heat-generating component and a second heat-generating component;

a first heat sink thermally coupled to the first heat-generating component, and a second heat sink thermally coupled to the second heat-generating component; and a first fan that generates an airflow in a direction of the first heat sink, wherein the second heat sink is arranged behind the first heat sink in a direction of flow of the airflow generated by the first fan; and an air duct is arranged between the first heat sink and a blow-out opening of the first fan such that a first part of generated airflow is exclusively supplied through the air duct to the first heat sink and a second part of the generated airflow flows laterally around the air duct and the first heat sink such that the second part of the generated airflow flows to the second heat sink, wherein the air duct is arranged such that the second part of the generated airflow directly flows to the second heat sink without a further air guiding element or air duct.

16. The cooling arrangement according to claim 15, wherein an area of the blow-out opening overlaps an area of the first heat sink, which area faces the blow-out opening and is projected into a plane parallel to the blow-out opening.

17. The cooling arrangement according to claim 15, wherein the air duct has a flow cross section corresponding to an area of the first heat sink, which area faces the blow-out opening and is projected into a plane parallel to the blow-out opening.

18. The cooling arrangement according to claim 15, wherein the air duct is a hollow body with a first opening and with a second opening opposite the first opening, wherein the first opening faces the blow-out opening of the first fan and the second opening faces the first heat sink.

* * * * *